United States Patent [19]
Narayanan et al.

[11] Patent Number: 5,360,767
[45] Date of Patent: Nov. 1, 1994

[54] METHOD FOR ASSIGNING PINS TO CONNECTION POINTS

[75] Inventors: Vinod Narayanan, Fishkill; Philip Honsinger, Poughkeepsie, both of N.Y.; Lok T. Lui, Berkeley, Calif.; Shuhui Lin, Poughkeepsie, N.Y.

[73] Assignee: International Business Machines Corporation, Armonk, N.Y.

[21] Appl. No.: 44,659

[22] Filed: Apr. 12, 1993

[51] Int. Cl.⁵ ............................................. H01L 21/18
[52] U.S. Cl. ................................... 437/208; 437/250; 257/697
[58] Field of Search ................. 257/206, 207, 208–211, 257/697; 364/491; 437/208, 189, 250

[56] References Cited

U.S. PATENT DOCUMENTS

| | | | |
|---|---|---|---|
| 4,577,276 | 3/1986 | Dunlop et al. | 364/491 |
| 4,615,001 | 9/1986 | Hudgins, Jr. | 364/200 |
| 4,615,011 | 9/1986 | Linsker | 364/491 |
| 4,742,471 | 5/1988 | Yoffa et al. | 364/491 |
| 4,777,606 | 10/1988 | Fournier | 364/491 |
| 4,829,446 | 5/1989 | Draney | 364/488 |
| 4,839,821 | 6/1989 | Murakata | 364/491 |
| 4,852,015 | 7/1989 | Doyle, Jr. | 364/491 |
| 4,852,016 | 7/1989 | McGehee | 364/491 |
| 4,890,238 | 12/1989 | Klein et al. | 364/491 |
| 4,903,214 | 2/1990 | Hiwatashi | 364/491 |
| 4,908,772 | 3/1990 | Chi | 364/491 |
| 4,965,739 | 10/1990 | Ng | 364/491 |
| 4,975,854 | 12/1990 | Yabe | 364/491 |
| 5,072,402 | 12/1991 | Ashtaputre et al. | 364/491 |
| 5,151,868 | 9/1992 | Nishiyama et al. | 364/491 |

OTHER PUBLICATIONS

Jingsheng Cong "Pin Assignment with Global Routing" 1989 Urbana, Ill.
Massoud Pedram et al. "Floorplanning with Pin Assignment" 1990 Berkeley, Calif.
E. B. Eichelberger et al. "Differential Current Switch—High performance at low power" *IBM Journal of Research and Development* pp. 313–319, vol. 35, No. 3 May 1991.

*Primary Examiner*—Olik Chaudhuri
*Assistant Examiner*—H. Jey Tsai
*Attorney, Agent, or Firm*—Aziz M. Ahsan; Peter W. Peterson

[57] ABSTRACT

A method of assigning pins to corresponding connection points in the design of computer modules where connection points on one layer need to be electrically connected through the pins to a wiring layer so as to minimize the length of the wiring between the points. A best area for selecting a pin is identified for each point that needs to use a pin, and pins are preferentially assigned to the points from their respective best areas. The method introduces a consideration of the direction of the destination point into the assignment solution and allows previous assignment methods to be used which incorrectly assumed that the direction to the destination point could be ignored.

8 Claims, 2 Drawing Sheets

METHOD FOR ASSIGNING PINS TO CONNECTION POINTS

BACKGROUND OF THE INVENTION

1. Field of the Invention

This invention relates to a method of assigning pins to corresponding connection points which need to be electrically connected through the pins so as to minimize the length of the interconnection. More particularly, the invention relates to a method of assigning pins which make connection between different levels of wiring media, typically in a computer package containing multiple chips, where the wiring occurs on one level and the connection points are on another level.

2. Description of Related Art

The method of this invention is appropriate for use in designing electrical circuit packages where a connection needs to be made for example between two points on a first level through wiring on a second level connected to the first level with pins or vias. The goal is to assign a pin to each connection point that needs a pin, in a way that minimizes the length of the wires making the connections. This problem occurs in many applications for wiring. The application described in detail herein involves the assignment of pins on a multilayered module, such as a MCM, for wiring between two circuits on chips mounted on the multi-chip module (MCM).

Integrated packages containing electrical circuits, such as MCMs used in large computers, are formed from multiple chips mounted on a wiring substrate of one or more layers through which interconnections between chips are made. The chips typically on an upper layer of the package have inputs and outputs (connection points) which need to be connected to corresponding inputs and outputs on the other chips.

To make a simple connection between points located on different chips, however, three wires and two pins are needed. The first wire is an on-chip wire formed in the first chip from the first connection point to a first pin assigned to the first connection point. The first pin connects the chip to the wiring layer below. The second wire is formed in the wiring layer from the first pin to a second pin assigned to the second connection point. The second pin connects the wiring layer below to the second chip. The third wire is formed in tile second chip and connects the second pin to its connection point, thereby completing the connection.

When making these wiring connections it is important to keep the total length of the wiring as short as possible. This invention relates to a method of determining which pins should be used in the connections between two or more connection points so as to meet the objective. The assignment of pins for use in the wiring is subject to several restrictions. First, there are a limited number of pins on each chip. Assigning a pin to a specific connection point precludes its use by another connection point, that may have a more pressing need to use that pin. Second, there is a maximum length for wires formed in the chip from the point to its assigned pin. If pins are too far from their connection points, this length limit is exceeded and the circuit will not work. Third, there is a maximum length for wires formed in the wiring layer between any two pins. Other restrictions may also apply, such as minimum distances or restrictions due to noise immunity and the like.

In addition to use in the design of chips mounted on a wiring layer, the invention may also be used in connection with other related design problems. For example, the wiring layer of newer MCMs constructed of multiple thin film wiring layers above multiple glass ceramic wiring layers.

"Hybrid pins" in such modules make connection between the different types of wiring layers. A "hybrid pin" is a pin used to make an electrical connection between the thin film layers and the glass-ceramic layer. Thus, simple connections between two chips pass through four pins and five wires. Two on-chip wires carry signals to/from two chip pins which connect to the thin film layers. Two thin film wires carry signals from chip pins to hybrid pins. Two hybrid pins make connection between the thin film layers and the glass ceramic layers and one wire is formed in the glass ceramic layer. The same problem exists when assigning hybrid pins to chip pins as is found when assigning chip pins to connection points as described above.

Other applications for the method include selecting test points for testing chips mounted on printed circuit boards and assigning multi-chip modules input/output points based on board constraints.

In prior art methods of assigning pins, the assignment of the pins has been conducted so as to minimize the distance from the connection point to the pin being assigned. In a common prior art method, all of the connection points on a chip that need a pin are assigned an available pin by calculating a cost for assigning each pin to each connection point. The cost is based on the distance between the pin and the point. A linear assignment algorithm is then used to minimize the sum of the assignment costs.

However, this procedure treats the assignment of pins on each chip as independent of all other assignments in the problem. It achieves a solution that is optimum only in the sense that it minimizes the length of the wires on the chip.

Thus, two points that are equally distant from a connection point on the chip will generally have the same assignment cost and have an equal likelihood of being assigned. This is true, even if one of the pins exits the chip on the side nearest to the destination chip and the other exits on the opposite side. If the pin exiting the chip in the wrong direction is assigned, the length of the wire on the wiring layer or media will be much longer than necessary. Thus, previous assignment methods have treated the assignment of pins on each chip as being independent, even though they are not.

This has been done in part due to the complexity of the total problem. Even with the simplifying assumption of independence, calculations are complex. Moreover, there is a reluctance to discard present computer program tools and assignment methods developed with a great deal of effort subject to this underlying assumption.

Accordingly, an object of the invention is to provide a method for assigning pins to connection points which considers factors relating to the final destinations of the connections, so as to minimize the total length of the connection, but which may be used with previously developed computational tools that do not consider such factors.

A further object of the present invention is to provide a method of assigning pins to connection points to minimize total wiring length on all wiring media or layers.

Another object of tile invention is to provide a method of assigning pins to connection points which includes a consideration of interdependent constraints for algorithms that assume that the constraints are independent.

Yet another object of the invention is to provide a method for assigning pins to connection points which provides a simplified computational method.

SUMMARY OF THE INVENTION

The above and other objects, which will be apparent to those skilled in the art, are achieved in the present invention which is directed to a method for assigning pins to connection points. The method involves identifying a first connection point that needs to be assigned to a pin and a destination point to be connected to the first connection point through the pin. The location of a first area about the first connection point is then computed. The first area includes pins that are within a distance set by the length limit for wires connected to the first connection point. The location of a second area is then computed about the destination point defined by a length limit for wires connected to the destination point. Finally, the location of an enclosing area which just surrounds the first connection point and the destination point is determined.

After these areas are found, the best area for selecting the pin to be assigned to the first connection point is determined by calculating the intersection of the three defined regions: the first area, the second area and the enclosing area. A pin within this best area is preferably assigned to the first connection point.

To implement the invention for the assignment of multiple connection points, and to use it with prior art assignment methods, a cost is calculated for assigning each of a plurality of available pins to the first connection point. The lowest cost is assigned for pins that fall within the best area for pin assignment for the first connection point. Other factors may be introduced into the cost according to prior art methods.

The preceding steps are then repeated for each connection point that needs to be assigned a pin. This results in a cost matrix in which a cost has been determined for assigning each potential pin to each point that might use it. The cost for pins located in the best area for each point will have a cost lower than the cost for pins outside that area. Pin assignment is then completed through a linear assignment algorithm.

DESCRIPTION OF THE PREFERRED EMBODIMENT

Figure 1:
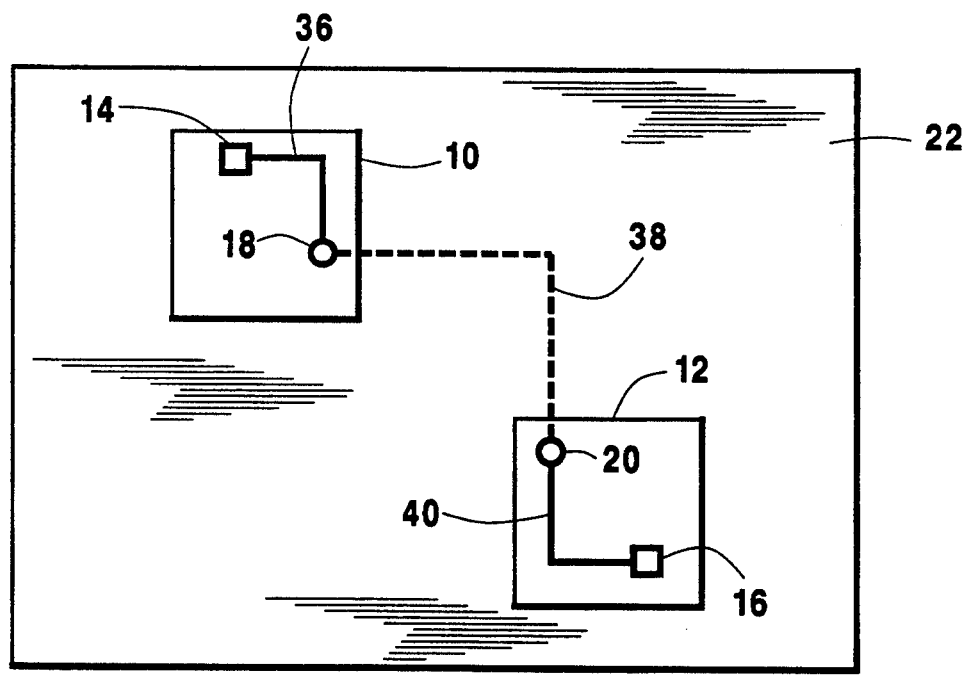
FIG. 1 is a top plane view of a two chip multi-chip module (MCM) with pins and connection points to be assigned according to the present invention.
Figure 2:
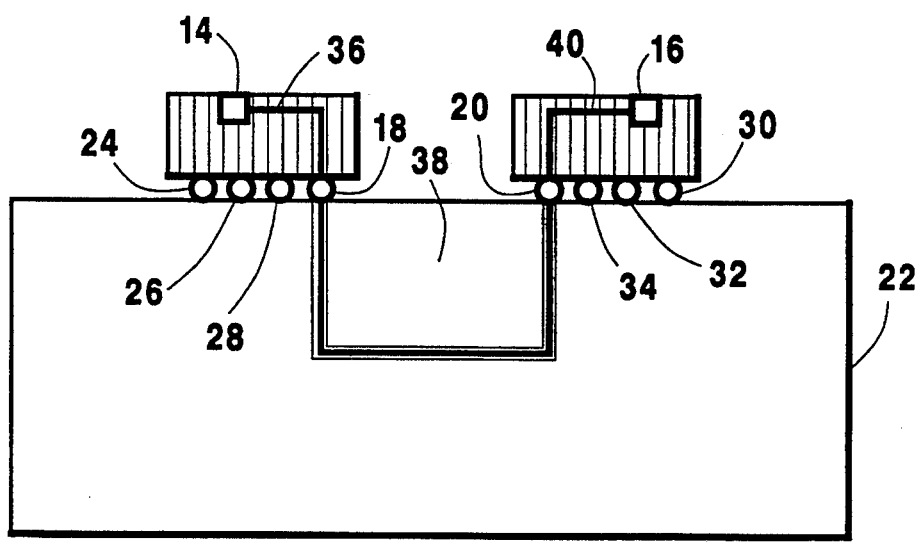
FIG. 2 is a side elevational view of the multi-chip module of FIG. 1.

FIGS. 1 and 2 illustrate the simplest form of the problem wherein a first chip 10 has a connection point 14 that needs to be connected to a second connection point 16 located on chip 12. For the ease of understanding the present invention, other connection points on each chip and most of the other pins that would be available for assignment in a real module have not been shown. The connection points 14, 16 are usually inputs or outputs from the circuits on their chip.

As will be discussed more fully in the description of FIG. 4 below, the method of the invention is also suitable for use in situations wherein a connection point on one chip needs to be connected to several other connection points on other chips. This occurs, for example, where the output of a logic circuit on one chip needs to drive the inputs of several other logic circuits located on several other chips.

In order to make the connection from point 14 to point 16, a pin must be assigned to each connection point 14, 16 which permits the on-chip wires 36, 40 to make contact with the wiring media or MCM 22. In the simplified side view of FIG. 2, there are available solder balls or electrical connections or vias or pins 18, 24, 26, 28 on chip 10 and available solder balls or electrical connections or vias or pins 20, 30, 32, 34 on chip 12. One of the pins on each chip must be assigned for use by the connection point on that chip. It needs to be recognized, however, that there are numerous other connection points on each chip (not shown) that also need to be assigned a pin.

The choice of the pin to be assigned to connection point 14 affects the length of all the on-chip wiring in two ways. First, it sets the length of the on chip wire 36 between connection point 14 and its pin 18. Second, it affects the length of other point to pin wires on the same chip because it precludes use of the assigned pin 18, by other connection points. This forces the other points to use other, possibly more distant pins. However, the assignment of pin 18, to connection point 14, also directly affects the length of the off-chip wiring to connection point 16, by setting the length of wire 38, in the wiring media or MCM 22, from the assigned pin 18, to the pin 28, assigned to connection point 16.

Prior art assignment methods have only considered the on-chip wiring effects, by assuming that the assignment of pins on each chip can be conducted independently and by trying to minimize the length of wires on the chip during the pin assignment process. Such methods have generally ignored the off-chip effects. One of the reasons could be due to computational difficulties or may be because the location of the second pin (assigned to the destination point 16)is not known until it is assigned.

Figure 3:
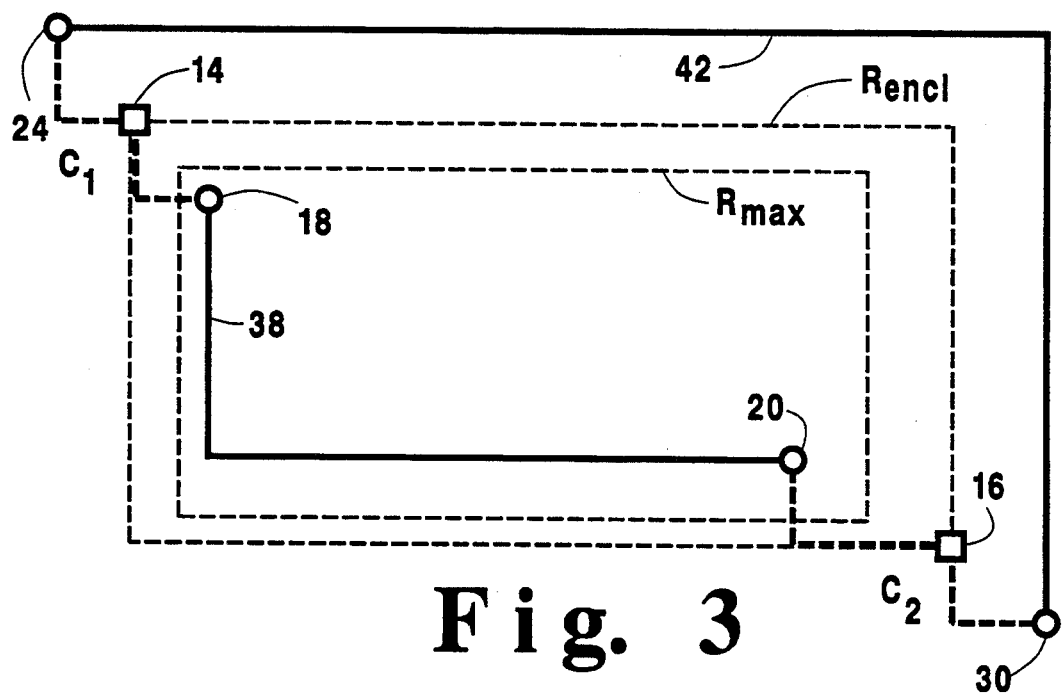
FIG. 3 is a diagrammatic top plane view of the two chip multi-chip module of FIG. 1 showing connection points, alternative pins and limiting areas.

One of the problems with the prior art method is illustrated more fully in FIG. 3. Before pins are assigned, connection point 14 could use any of the pins 18, 24, 26, 28 on chip 10. To simplify the analysis, only two of the pins that might be assigned to point 14 (pins 18 and 24) and two of the pins that might be assigned to point 16 (pins 20 and 30), are shown in FIG. 3.

Prior art pin assignment methods have simply considered the distance from the connection point 14 to the potential assignable pins 18, 24 and placed a cost upon the potential assignment based upon that distance. A cost was also placed upon the potential assignment of those pins to other connection points that might use the pins based on their distance from the pins. A linear assignment algorithm was then run on the point to pin assignment cost matrix in order to determine an optimal assignment of each of the connection points to a specific one of the available pins. The result was optimum, however, only in the sense that on-chip wiring was minimized.

Referring still to FIG. 3, this prior art method treats the assignment of pin 18 to connection point 14 to have the same cost as the assignment of pin 24 to point 14, because these pins are equidistant from connection point 14. In the same way, prior art assignment methods would consider pins 20 and 30 to have an equal cost for assignment to connection point 16 because each lies equidistant from pin 16.

As can easily be seen, however, assigning pins 24 and 30 to points 14 and 16, respectively, leads to a far longer wire 42 in the wiring media 22, than does the assignment of pins 18 and 20 which results in wire 38. The problem arises because, contrary to the assumption of prior art methods, one cannot simply independently minimize the length of all point-to-pin on-chip wires on each chip and expect to reach an optimum solution that minimizes the total length of the wiring between connection points located on different chips. Some consideration needs to be given to where the wiring is going when it leaves a chip.

The problem with prior art methods can be serious because there exists a maximum length for wires which may be formed in the wiring media 22, and the incorrect assignment may result in a wire in the wiring media that exceeds this limit. This is illustrated in FIG. 3 where the length limit in the wiring media 22 is less than the manhattan distance between connection points 14, 16. "Manhattan distance" is the distance between two points measured horizontally plus the distance between the points measured vertically, as though one was traversing a right angle grid of downtown city streets when moving between points. This is the critical characteristic for circuits where all wiring runs are along vertical or horizontal lines.

For any given length limit, a maximum size area, such as a rectangle, can be drawn that encloses only point pairs where the manhattan distance between the pairs is less than or equal to that limit. In FIG. 3 area or rectangle $R_{max}$ is such a rectangle. The assignment of pins 18 and 20, located within $R_{max}$ results in wire 38. Wire 38 is less than the length limit of the wiring media 22. The assignment of pins 24 and 30 results in wire 42 which exceeds the length limit.

The problem is even more complex when additional connection points are considered which must be connected through the wiring media 22. The method of the invention as applied to a multiple connection point problem is illustrated in FIG. 4.

Figure 4:
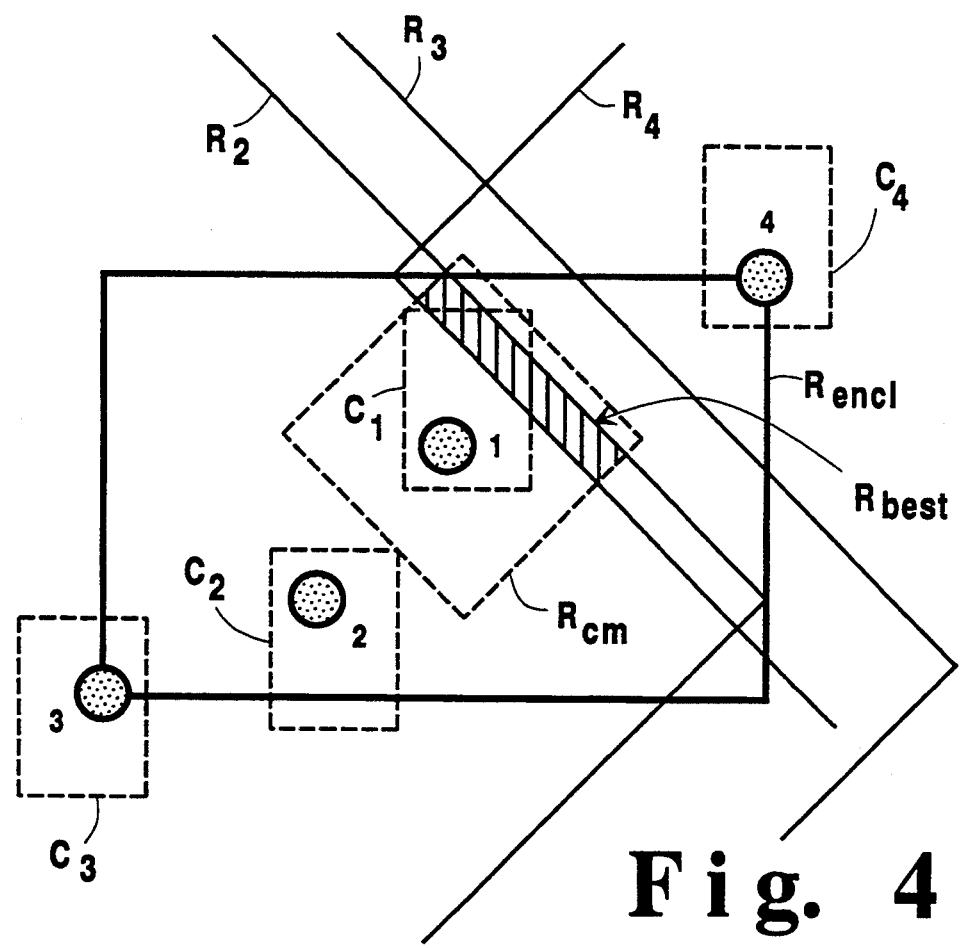
FIG. 4 is a top plane view of a multiple chip thermal conducting module with connection points, pins and wiring to be assigned showing, enclosing areas and length limits areas used in the method to identify the best area for pin assignment.

FIG. 4 graphically illustrates the method of tile invention. When trying to select a pin to be assigned to a connection point on a chip, the method of the invention identifies a best area for selecting a pin. Pins located within that area are preferentially assigned to the connection point during the pin assignment process. A best area for pins is individually determined for each connection point that needs to use a pin. In this way, the present invention may be used with prior art methods of pin assignment to introduce considerations of the direction to the destination point.

The preferred method of implementing the assignment is to calculate the cost for assigning each of the available pins on a chip to the connection point. Pins located within the best area for each connection point are given the lowest cost. Pins located beyond any length limitation for on-chip wiring or which are otherwise unsuitable are given an infinite cost or at least a cost sufficiently high to preclude their assignment. Once each connection point has been assigned a cost for assignment to each pin, a linear assignment algorithm may be employed to assign each connection point a corresponding pin in a way which minimizes the total assignment cost and maximizes the likelihood that each connection point will be assigned a pin located within its best area for assignment.

Referring to FIG. 4, four connection points are shown, and identified as connection point 1, connection point 2, connection point 3 and connection point 4. The electrical connection points are located on chips $C_1$, $C_2$, $C_3$ and $C_4$, which chips themselves are located on the MCM 22. In the circuit being designed, all of these connection points must be connected by a single electrical wire located in the wiring layer. Thus, each must have a pin assigned to it permitting connection to the wiring layer, and each of their pins must be connected to a pin assigned to connection point 1.

The graphical illustration of FIG. 4 illustrates the step during the assignment of pins on $C_1$ in which the best area for assigning a pin to connection point 1 is calculated. The calculation of the best area considers the fact that the pin is ultimately to be connected to pins assigned to connection points 2, 3 and 4, even though those pins have not yet been assigned. The method is modified slightly during the assignment of pins on chip $C_2$ because the destination pin on $C_1$ is known, because we are assuming that the pins on $C_2$ are assigned after the pins on $C_1$.

In the completion of the solution for $C_1$, all of the other connection points on $C_1$ will have a corresponding best area for assignment calculated. This results in a cost for assigning each available pin to each connection point that needs a pin. The cost is set to a minimum for pins located within the best area for assignment. A linear assignment algorithm can then be run for chip $C_1$ to assign its pins to the connection points in a way which minimizes the sum of the assignment costs.

Continuing to refer to FIG. 4, the best area for assignment is identified by an area or rectangle $R_n$, where n is the specific defined area. Where $R_{best}$ is the best or most optimum rectangle, $R_{best}$ is found as the intersection of five rectangles, $R_{cm}$, $R_{encl}$, $R_2$, $R_3$, and $R_4$.

$R_{encl}$ is the enclosing rectangle defined by the smallest rectangle which encloses all of the connection points. $R_{cm}$ is the boundary represented by the maximum allowable length of wires formed on the chip. $R_{cm}$ is a square centered on connection point 1 with its sides at 45° and 135° to the horizontal. This square is often called a "manhattan circle" because all points on this square are equidistant from its center if the distance is measured as a sum of vertical and horizontal distances. Therefore the wires on the chip $C_1$ must travel in horizontal and vertical paths within a maximum manhattan distance from the center of the manhattan circle and lie within a square of the type shown.

$R_2$, $R_3$, and $R_4$, are length limit areas or rectangles centered about specified points and thus form manhattan circles, centered about connection points $C_2$, $C_3$, and $C_4$, respectively. These length limit rectangles are calculated based on the restriction imposed by the length limit on the connections between circuits. For example, $R_2$ is derived by assuming that the connection between connection point 1 and connection point 2 starts from connection point 2 and ends up on the pin assigned for connection point 1. Thus, $R_2$ represents a manhattan circle of the maximum possible length between connection point 2 and the pin assigned to connection point 1 drawn with connection point 2 at the center. It encloses the area within which a pin can be selected so that the limit on the maximum connection length can be satisfied.

Note that this does not guarantee that the length limit will be satisfied because a pin has not yet been assigned to connection point 2. However, since a similar analysis will be made when the pin is selected for connection point 2, there is a good chance that the assignments for chip $C_1$ will be satisfactory. Similar rectangles, $R_3$, $R_4$ are derived for each of the other connections to connection point 1. The best area for selecting a pin to be assigned to connection point 1 is derived by intersecting all of the different rectangles representing the various length limits. This best area is denoted by $R_{best}$. Therefore, $R_{best} = R_{encl} \cap R_2 \cap R_3 \cap R_4 \cap R_{cm}$, where $\cap$ represents intersection. The assignment routine may also consider the intersection between $R_{best}$ and the chip outline for $C_1$ (which represents the only locations where a pin may be found).

Since all of the different rectangles being considered are manhattan circles (except $R_{encl}$), their sides lie parallel to the 135° or 45° axis. This insures that the resulting intersection of these rectangles is also a rectangle. If the rectangles with their sides along the 135° or 45° axis are expressed in the coordinate system of $v = x + y$, $u = y - x$, they will have sides parallel to the transformed axes, and the computation of the intersections of the rectangles can be performed in a simple way. The enclosing rectangle, $R_{encl}$ does not need this axis transformation and its intersection can be computed separately from the other intersections.

Thus, in one aspect the invention includes the following steps which lead to a best area for assigning a pin to a connection point:

a. identifying a first connection point that needs to be assigned to a pin and a destination point to be connected to the first connection point through the pin;

b. computing the location of a first area about the first connection point defined by a length limit for wires connected to the first connection point;

c. computing the location of a second area about the destination point defined by a length limit for wires connected to the destination point;

d. computing an enclosing rectangle for the first connection point and the destination point; and e. determining a best area for selecting the pin to be assigned to the first connection point by calculating the intersection of the first area, the second area and the enclosing rectangle.

Continuing the assignment of pins to points can be accomplished with the following steps:

f. computing a cost for assigning each of a plurality of pins to the first connection point;

g. assigning the lowest cost for pins that fall within the best area for pin assignment for tile first connection point;

h. repeating steps (a) through (g) for each connection point that needs to be assigned a pin; and i. performing pin assignment.

In this way, the invention allows the use of assignment methods that are based on the assumption of independence, while incorporating factors that consider the destination of the wire connection.

The invention has been described above in connection with minimizing wire lengths where connection points on chips are assigned to pins on chips. However, tile method is also applicable in solving other types of assignment problems, for example, in the assignment of hybrid pins which are used in multi-chip modules containing two or more types of wiring layers. MCM's of this type have a first set of upper wiring layers formed in thin film media and a second set of wiring layers formed in the thick film media or ceramic glass.

Connection points on the chips are connected to pins on the chip through on-chip wiring which connects to the thin film wiring layer as described earlier. The thin film wire then connects to a hybrid pin which makes connection to the ceramic glass layers. Hybrid pins need to be assigned for use by the chip pins to electrically connect to the ceramic glass layer.

Thus, the problem of assigning hybrid pins to chip pins is the same as the problem of assigning connection points to chip pins as described above. In this version of the problem, connection points 14, 16 correspond to chip pins 18, 20, respectively, and chip pins 18, 20 correspond to the hybrid pins. The on chip connection wires 36, 40 correspond to connection wires formed in the thin film media and the wire 38 corresponds to the wire in the ceramic glass layers.

Many other applications in multi layer circuit boards with vias connecting the layers will also be apparent to those skilled in the art.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for assigning pins connecting first and second layers of a multilayer electrical device to connection points located on the first layer and for connecting the connection points to assigned pins which are to be further connected through wiring located on the second layer, comprising the steps of:

a. identifying the location of a first connection point on the first layer that needs to be assigned to a pin and the location of a destination point to be connected to the first connection point through the pin;

b. computing the location of a first area located about the first connection point, the first area including all points on the first layer within a first length limit distance from the first connection point, the first length limit distance being determined by physical characteristics of the first layer that limit the length of wires formed within the first layer;

c. computing the location of a second area located about the destination point, the second area including all points on the second layer within a second length limit distance from the destination point, the second length limit distance being determined by physical characteristics of the second layer that limit the length of wires formed within the second layer;

d. computing an enclosing rectangle for the first connection point and the destination point, the first connection point and the destination point being located on opposite vertices of the enclosing rectangle;

e. determining a best area for selecting the pin to be assigned to the first connection point by calculating the overflapping intersection of the first area, the second area and the enclosing rectangle;

f. assigning a pin located within the best area to the first connection point; and g. connecting the first connection point to the second layer through the assigned pin by forming a wire in the first layer between the first connection point and the assigned pin, the wire having a length that is no longer than the first length limit.

2. A method for assigning pins to connection points according to claim 1 wherein:

step (a) comprises identifying the location of a second connection point as the destination point when no pin has been assigned for use by the second connection point and identifying the pin assigned for use by the second connection point as the destination point when a pin has been previously assigned for use by the second connection point.

3. A method for assigning pins to connection points according to claim 1 wherein:

step (b) comprises computing a first manhattan circle as the first area, centered about the first connection point, the first manhattan circle having a manhattan length diameter determined by the first length limit and;

step (c) comprises computing a second manhattan circle as the second area, centered about the destination point, the second manhattan circle having a manhattan length diameter determined by the second length limit.

4. A method for assigning pins to connection points according to claim further comprises:

in step (a) identifying at least one additional destination point to be connected to the first connection point through the pin;

the method further includes the step of computing the location of an area about each additional destination point that includes pins closer to the additional destination point than a length limit for wires from the additional destination point to the pin;

in step (d) computing an enclosing rectangle for the first connection point and all destination points; and in step (e) determining a best area for selecting the pin to be assigned to the first connection point by calculating the intersection of the first area, the second area, the enclosing rectangle and all areas about additional destination points.

5. A method for assigning pins to connection points according to claim 1, further including the steps of:

h. computing a cost for assigning each of a plurality of pins to the first connection point;

i. assigning the lowest cost for pins that fall within the best area for pin assignment for the first connection point;

j. repeating steps (a) through (i) for each connection point that needs to be assigned a pin; and k. performing pin assignment.

6. A method for assigning pins to connection points according to claim 5, wherein step (k) includes the step of performing pin assignment by linear assignment to minimize the total assignment cost.

7. A method for assigning pins to connection points according to claim 1, wherein step (e) includes the step of transforming coordinate systems for the first and second areas, the step of transforming coordinate systems being performed before the step of calculating the intersection of the first and second areas.

8. A method for assigning pins to connection points according to claim 7, wherein the first and second areas are initially in an x, y coordinate system and the step of transforming coordinate systems comprises transforming the x,y coordinate system of the first and second areas into an $(x+y),(x-y)$ coordinate system before calculating the intersection of the first and second areas.

* * * * *

UNITED STATES PATENT AND TRADEMARK OFFICE
CERTIFICATE OF CORRECTION

PATENT NO. : 5,360,767
DATED : November 1, 1994
INVENTOR(S) : Narayanan et al.

It is certified that error appears in the above-identified patent and that said Letters Patent is hereby corrected as shown below:

Column 1, line 46: "tile" should read - -the- -.

Column 2, line 67: "tile" should read - -the- -.

Column 5, line 51: "tile" should read - -the- -.

Column 8, line 2: "tile" should read - -the- -.

Column 9, line 38: "1" should be inserted after the word claim.

Signed and Sealed this

Thirty-first Day of January, 1995

Attest:

BRUCE LEHMAN

*Attesting Officer*     *Commissioner of Patents and Trademarks*